(12) United States Patent
Stachowiak

(10) Patent No.: US 7,223,479 B2
(45) Date of Patent: May 29, 2007

(54) HEAT TREATABLE COATED ARTICLE WITH DUAL LAYER UNDERCOAT

(75) Inventor: Grzegorz Stachowiak, Ann Arbor, MI (US)

(73) Assignee: Guardian Industries Corp., Auburn Hills, MI (US)

(*) Notice: Subject to any disclaimer, the term of this patent is extended or adjusted under 35 U.S.C. 154(b) by 29 days.

(21) Appl. No.: 10/672,066

(22) Filed: Sep. 29, 2003

(65) Prior Publication Data

US 2005/0069717 A1 Mar. 31, 2005

(51) Int. Cl.
*B32B 17/06* (2006.01)

(52) U.S. Cl. .............. 428/432; 428/446; 428/448; 428/697; 428/698; 428/699; 428/701; 428/702; 428/704

(58) Field of Classification Search .......... 428/432, 428/446, 448, 450, 697, 698, 699, 701, 702, 428/704
See application file for complete search history.

(56) References Cited

U.S. PATENT DOCUMENTS

| | | | |
|---|---|---|---|
| 5,242,560 A | 9/1993 | Lingle et al. | |
| 5,298,048 A | 3/1994 | Lingle et al. | |
| 5,344,718 A | 9/1994 | Hartig et al. | |
| 5,376,455 A | 12/1994 | Hartig et al. | |
| 5,514,476 A | 5/1996 | Hartig et al. | |
| 5,543,229 A * | 8/1996 | Ohsaki et al. | 428/432 |
| 5,688,585 A | 11/1997 | Lingle et al. | |
| 5,770,321 A | 6/1998 | Hartig et al. | |
| 5,800,933 A | 9/1998 | Hartig et al. | |
| 6,352,754 B1 * | 3/2002 | Frost et al. | 428/77 |
| 2002/0064662 A1 * | 5/2002 | Lingle et al. | 428/432 |

OTHER PUBLICATIONS

"Thermally Durable Sputter-Deposited Tin Oxide Films and Their Applications", (2003) Ebisawa et al., pp. 307-309.

* cited by examiner

*Primary Examiner*—Jennifer McNeil
*Assistant Examiner*—G. Blackwell
(74) *Attorney, Agent, or Firm*—Nixon & Vanderhye P.C.

(57) ABSTRACT

In certain example embodiments, a multi-layer undercoat may include a layer of or including tin oxide on the glass surface and a layer of silicon nitride thereover. Tin oxide is advantageous in that it is relatively durable, and is a low stress material with excellent adhesion to glass. Moreover, the sputtering rate for tin oxide is several times higher than that of silicon nitride. Thus, problems of high cost (due to slow deposition rate) and durability (due to high compressive stress) can be overcome through the use of tin oxide as a bottom portion of the dual layer overcoat. The coated article may or may not be heat treated in different embodiments of the invention.

20 Claims, 1 Drawing Sheet

HEAT TREATABLE COATED ARTICLE WITH DUAL LAYER UNDERCOAT

Figure 1:
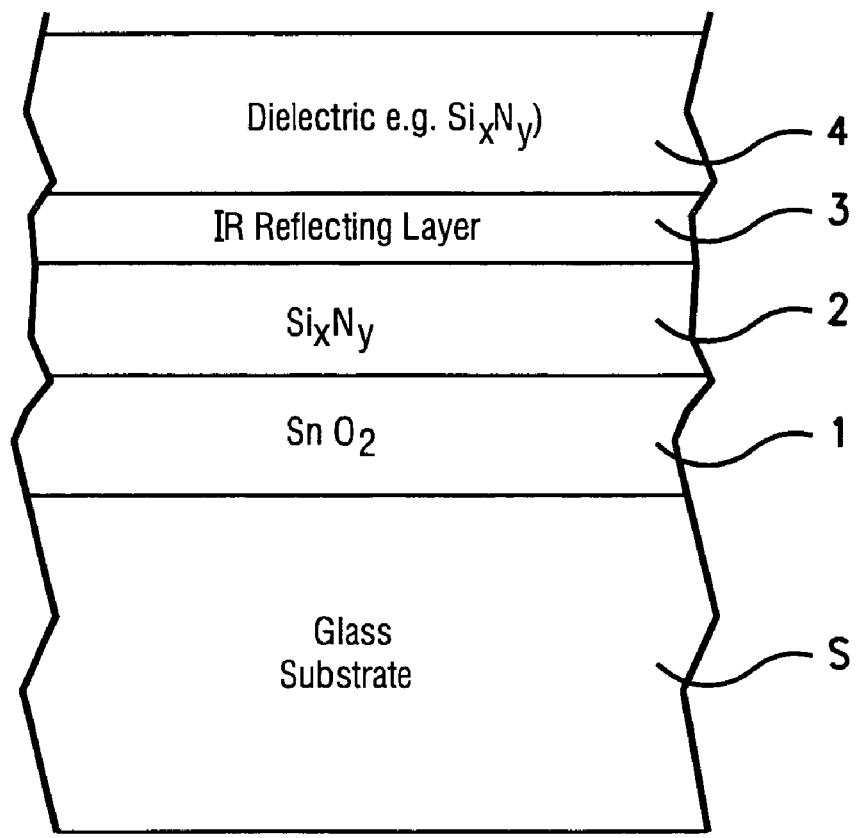

This invention relates to coated articles that include a multi-layer undercoat having a layer comprising tin oxide and a layer comprising silicon nitride. Such a coated article is heat treatable, durable, and/or may be manufactured in a quick and efficient manner. Such coated articles may be used in the context of monolithic windows, insulating glass (IG) window units, laminated windows, and/or other suitable applications.

BACKGROUND AND SUMMARY OF THE INVENTION

Solar control coatings having a layer stack of glass/$Si_3N_4$/NiCr/$Si_3N_4$ are known, where the metallic NiCr layer is the sole infrared (IR) reflecting layer in the coating. Unfortunately, while such layer stacks provide efficient solar control and are overall good coatings, they sometimes are lacking in terms of: (a) rate of manufacture; and (b) durability due to high compressive stress of the silicon nitride undercoat.

In particular, such solar control coatings which may be characterized by blue glass side reflective color require very thick silicon nitride undercoat layers in order to achieve the desired optical performance. The silicon nitride undercoat is typically from 600 to 900 Å thick. Unfortunately, the sputter-deposition rate of silicon nitride is very slow. As a result, production line speed for such coatings must typically be reduced significantly compared to other comparable coatings thereby leading to higher costs. Moreover, such a thick layer of silicon nitride (i.e., greater than about 600 Å) typically has very high compressive stress, which can lead to significant durability problems such as brush test failures.

In view of the above, it will be apparent to those skilled in the art that there exists a need for a solar control coating which can address and overcome one or both of the aforesaid disadvantages (i.e., high cost and durability).

An undercoat of titanium oxide (e.g., $TiO_2$) (on the glass) and silicon nitride is known in the art. Unfortunately, a problem of adhesion exists when silicon nitride is placed over titanium oxide. This problem results in bad durability, especially after heat treatment when delamination tends to occur upon durability testing. Moreover, the indices "n" and "k" of titanium oxide tend to significantly change upon heat treatment, sometimes leading to drastic color changes due to heat treatment. Thus, it can be seen that an undercoat of titanium oxide/silicon nitride on glass is problematic and undesirable.

In certain example embodiments of this invention, one or more of the aforesaid problems can be addressed and/or overcome by replacing a thick silicon nitride undercoat with a dual layer undercoat. In certain example embodiments, the dual layer undercoat may include a layer of or including tin oxide (e.g., $SnO_2$) on the glass surface and a layer comprising silicon nitride thereover. Tin oxide (any suitable stoichiometry) is advantageous in that it is relatively durable, and is a low stress material with excellent adhesion to glass. Moreover, the sputtering rate for tin oxide is much higher than that of silicon nitride. Thus, the aforesaid problems of high cost (due to slow deposition rate) and durability (due to high compressive stress) can be overcome through the use of tin oxide as a bottom portion of the overcoat.

Accordingly, the tin oxide portion of the undercoat allows the coating to be sputtered at a faster rate thereby reducing costs, and also allows part of the silicon nitride layer to be removed thereby reducing internal stress and improving durability. On the other hand, the silicon nitride portion of the undercoat is provided in order to prevent and/or reduce oxygen diffusion from the glass or tin oxide into the IR reflecting layer during heat treatment, thereby improving heat treatability.

In certain example embodiments of this invention, there is provided a coated article comprising: a glass substrate; a layer comprising tin oxide supported by the glass substrate and being located beneath any and all IR reflecting layer(s) of the coated article; a layer comprising silicon nitride provided on and contacting the layer comprising tin oxide; an infrared (IR) reflecting layer located over the layer comprising tin oxide and over the layer comprising silicon nitride; and a dielectric layer provided on the substrate over at least the IR reflecting layer.

IN THE DRAWINGS

FIG. 1 is a partial cross sectional view of an embodiment of a monolithic coated article (heat treated or not heat treated) according to an example embodiment of this invention.

DETAILED DESCRIPTION OF CERTAIN EXAMPLE EMBODIMENTS OF THE INVENTION

Certain embodiments of this invention provide coated articles that may be used in windows such as monolithic windows (e.g., vehicle, residential, and/or architectural windows), IG window units, and/or other suitable applications. Certain example embodiments of this invention provide a layer system that is characterized by at least one of: (a) efficient manufacturability; and (b) good mechanical durability. Coated articles may or may not be heat treated (HT) in different embodiments of this invention.

FIG. 1 is a side cross sectional view of a coated article according to an example embodiment of this invention. The coated article includes at least substrate S (e.g., clear, green, bronze, grey, blue, or blue-green glass substrate from about 1.0 to 12.0 mm thick), a dual layer undercoat including layer 1 of or including tin oxide (e.g., $SnO_2$) and layer 2 of or including silicon nitride, infrared (IR) reflecting layer 3 of or including NiCr, Nb, NbZr, $NbZrN_x$, or any other suitable material, and dielectric layer 4 which may be comprised of silicon nitride (e.g., $Si_3N_4$), tin oxide, or some other suitable dielectric such as a metal oxide and/or nitride. In certain example embodiments, the coated article has no IR reflecting layer comprising significant amount(s) of Ag or Au. Optionally, a protective overcoat of or including a material such as zirconium oxide (not shown) may be provided over layers 1–4 in certain example embodiments of this invention. Example protective overcoats comprising silicon nitride, zirconium oxide and/or chromium oxide which may be optionally be used in certain example embodiments of this invention are described in U.S. patent application Ser. No. 10/406,003, filed Apr. 3, 2003, the disclosure of which is hereby incorporated herein by reference.

It is noted that the terms "oxide" and "nitride" as used herein include various stoichiometries. For example, the term silicon nitride includes stoichiometric $Si_3N_4$, as well as non-stoichiometric silicon nitride. Layers 1–4 may be deposited on the glass substrate S via magnetron sputtering, any other type of sputtering, or via any other suitable technique in different embodiments of this invention.

In certain example embodiments of this invention, one or both of the aforesaid problems can be addressed and/or overcome through the use of a multi-layer undercoat such as a dual-layer undercoat. In certain example embodiments, the dual layer undercoat may include a layer of or including tin oxide (e.g., $SnO_2$) on the glass surface and a layer comprising silicon nitride thereover. Tin oxide is advantageous in that it is relatively durable, and is a low stress material with excellent adhesion to glass. Moreover, the sputtering rate for tin oxide is much higher than that of silicon nitride. Thus, the aforesaid problems of high cost (due to slow deposition rate) and durability (due to high compressive stress) can be overcome through the use of tin oxide as a bottom portion of the dual layer overcoat. The tin oxide layer may be pure tin oxide in certain example embodiments, or may include other materials such as nitrogen or other metal(s) in other embodiments of this invention.

Tin oxide and silicon nitride do not adhere to one another particularly well when the tin oxide is sputtered over the silicon nitride. However, when the silicon nitride is sputtered over the tin oxide, it has been found that the silicon nitride adheres well to the tin oxide. Moreover, the indices "n" and "k" of tin oxide do not significantly change as a result of heat treatment in many situations.

The tin oxide portion of the undercoat allows to the coating to be sputtered at a faster rate thereby reducing costs, and also allows part of the silicon nitride layer to be removed thereby reducing internal stress and thus improving durability. On the other hand, the silicon nitride portion of the undercoat is provided in order to prevent and/or reduce oxygen diffusion from the glass or tin oxide into the IR reflecting layer during heat treatment, thereby improving heat treatability.

While FIG. 1 illustrates a coating where the IR reflecting layer 3 is in direct contact with dielectric layers 2 and 4, and wherein layer 3 is the only IR reflecting layer in the coating, the instant invention is not so limited. Other layer(s) may be provided between layers 2 and 3 (and/or between layers 3 and 4) in certain other embodiments of this invention. Moreover, other layer(s) (not shown) may be provided between the glass substrate and layer 1 in certain non-preferred embodiments, and/or other layer(s) (not shown) may be provided on substrate over layer 4 in certain embodiments of this invention. Thus, while the coating or layers thereof is/are "on" or "supported by" the glass substrate (directly or indirectly), other layer(s) may be provided therebetween. Thus, for example, the layer system and layers thereof shown in FIG. 1 are considered "on" the substrate 1 even when other layer(s) (not shown) are provided therebetween (i.e., the terms "on" and "supported by" as used herein are not limited to directly contacting). Also, more than one IR reflecting layer may be provided in alternative embodiments of this invention.

In certain example embodiments of this invention, the index of refraction "n" of layers 1 and 2 is approximately the same. In other words, the index "n" of layers 1 and 2 does not differ by more than about 10%. In certain example embodiments, the index "n" of layers 1 and 2 is around 2. For instance, the index "n" of the tin oxide inclusive layer 1 may be from about 1.9 to 2.1, more preferably from about 1.95 to 2.05; whereas the index of refraction "n" of the silicon nitride inclusive layer 2 may be from about 1.9 to 2.5, more preferably from about 2.0 to 2.2. Since the indices "n" of layers 1 and 2 are approximately the same, or close, there is not significant optical effect on the coated article due to the use of the two layers 1 and 2 as opposed to a single thicker silicon nitride layer, and any small deviation from desired performance can be easily corrected by adjusting overall thickness of the dual-layer undercoat 1, 2 (e.g., by adjusting the thickness of layer 1, 2 or both). For instance, a conventional 800 Å silicon nitride single layer undercoat can be replaced with a dual layer undercoat including a 400 Å thick tin oxide layer 1 and a 400 Å thick layer of silicon nitride 2. Alternatively, a conventional 800 Å silicon nitride single layer undercoat can be replaced with a dual layer undercoat including a 500 Å thick tin oxide layer 1 and a 300 Å thick layer of silicon nitride 2; and so forth.

However, if heat treatability is desired, the thickness of the silicon nitride inclusive layer 2 cannot be below about 150 Å (more preferably not below 200 Å). If the thickness of the silicon nitride layer 2 is below this threshold, then oxygen will likely diffuse in significant amounts from the glass substrate and/or tin oxide layer 1 into the IR reflecting layer 3 during heat treatment (e.g., thermal tempering, heat strengthening, or heat bending). Also, the thickness of the silicon nitride layer 2 should not be above about 650 Å (more preferably no more than about 550 Å) so that the internal compressive stress of the layer does not become too high. Thus, silicon nitride inclusive layer 2 is preferably from about 150 to 650 Å thick, more preferably from about 200 to 550 Å thick. The silicon nitride layer 2 typically includes some other material such as aluminum, stainless steel, or the like (from about 0–15%, more preferably from about 1–12%) as will be appreciated by those skilled in the sputtering art.

In a similar manner, the tin oxide layer may include some nitrogen or other material as is known in the art. In embodiments where the tin oxide layer further includes nitrogen (i.e., tin oxynitride), improved heat treatability may result. In certain embodiments, the atomic amount of nitrogen in the tin oxide inclusive layer in such embodiments may be from 1–50%, more preferably from 1–40%, more preferably from 2–30%, and most preferably from 3–20%.

Some thickness correction may have to be used, as typically the refractive index "n" of tin oxide is about 2.0 whereas that of silicon nitride may be slightly higher. To compensate for possible difference between "n" values of the layers 1 and 2, the physical thickness of the tin oxide inclusive layer 1 may be made slightly higher than that of the removed portion of the silicon nitride layer 2 (e.g., from about 1–20% higher, more preferably from about 1–10% higher, and most preferably from about 1–7% higher). This may allow the optical thickness (n*d) of the tin oxide layer 1 to be approximately the same as or slightly higher than that of the silicon nitride layer portion subtracted from the undercoat in certain example embodiments.

The aforesaid solution to the problem(s) discussed above can lead to significant reduction in manufacturing costs by speeding up production by a factor of 2 or so), and can also reduce the occurrence of stress induced failures observed during brush tests or the like, as tin oxide has a comparatively low compressive stress characteristic.

While FIG. 1 illustrates a coated article according to an embodiment of this invention in monolithic form, coated articles according to other embodiments of this invention may comprise IG (insulating glass) window units. In IG embodiments, the coating from FIG. 1 may be provided on the inner wall of the outer substrate of the IG unit, and/or on the inner wall of the inner substrate, or in any other suitable location in other embodiments of this invention.

Turning back to FIG. 1, various thicknesses may be used consistent with this invention. According to certain non-limiting example embodiments of this invention, example thicknesses and materials for the respective layers 1–4 on the glass substrate are as follows:

TABLE 1

(Example non-limiting thicknesses)

| Layer | Example Range (Å) | Preferred (Å) | Example (Å) |
|---|---|---|---|
| tin oxide (layer 1): | 150–650 Å | 200–550 Å | 250–400 Å |
| silicon nitride (layer 2): | 150–650 Å | 200–550 Å | 250–400 Å |
| NiCr, NbZr or like (layer 3): | 30–700 Å | 100–500 Å | 120–350 Å |
| silicon nitride (layer 4): | 10–900 Å | 100–800 Å | 150–500 Å |
| layers 1 & 2 combo (blue): | 700–900 Å | 750–850 Å | 800 Å |
| layers 1 & 2 combo (green): | 1,000–1,400 Å | 1,000–1,300 Å | 1,100 Å |

In can be seen above that for blue glass side reflective color to be achieved, the combined thickness of the tin oxide layer 1 and the silicon nitride layer 2 is from 700 to 900 Å, more preferably from 750 to 850 Å. The products of this invention are much improved compared to the art discussed in the background section herein, since the required silicon nitride thickness is much less. In particular, certain example embodiments of this invention allow blue glass side reflective color to be achieved with no more than about 550 Å (more preferably no more than about 400 Å) of silicon nitride being needed below the bottom IR reflecting layer. While this invention is not limited to blue glass side reflective color unless expressly claimed, blue color is preferred in certain embodiments of this invention. It can be seen that a particular range of thickness set forth in the table above for layers 1 and 2 can be used when green glass side reflective color is desired.

Layers 1–4 may be deposited in any suitable manner; however, sputtering is preferred in certain example embodiments. For example, silicon nitride layer 2 may be sputtered using a SiAl target, using argon and nitrogen gas flows; and the tin oxide layer 1 may be sputtered using a Sn target using argon, oxygen and a small amount of nitrogen gas flow.

In certain exemplary embodiments, the color stability with HT may result in substantial matchability between heat-treated and non-heat treated versions of the coating or layer system.

Before heat treatment (HT) such as thermal tempering, in certain example embodiments of this invention coated articles have color characteristics as follows in Table 2 (monolithic and/or IG unit). It is noted that subscript "G" stands for glass side reflective color, subscript "T" stands for transmissive color, and subscript "F" stands for film side color. As is known in the art, glass side (G) means reflective color when viewed from the glass side (as opposed to the layer/film side) of the coated article. Film side (F) means reflective color when viewed from the side of the coated article on which the coating is provided.

TABLE 2

Color/Optical Characteristics (non-HT)

| | General | Preferred | Most Preferred |
|---|---|---|---|
| $T_{vis}$ (TY): | 6–80% | 10–50% | 12–30% |
| $L^*_T$ | 29–92 | 37–76 | 41–62 |
| $a^*_T$ | −12 to +12 | −6 to +6 | −3 to +2 |
| $b^*_T$ | −20 to +20 | −15 to +10 | −10 to +10 |
| $R_G Y$(glass side): | 8–50% | 10–40% | 12–30% |
| $L^*_G$ | 34–76 | 37–70 | 41–65 |
| $a^*_G$ | −20 to +12 | −12 to +5 | −6 to +2 |
| $b^*_G$ | −30 to +20 | −25 to +10 | −20 to +10 |
| $R_F Y$(film side): | 8–50% | 8–40% | 12–35% |
| $L^*_F$ | 34–76 | 37–70 | 41–68 |
| $a^*_F$ | −20 to +20 | −12 to +12 | −5 to +5 |
| $b^*_F$ | −40 to +40 | −30 to +30 | −20 to +30 |
| $T_{sol}$ (TS %): | 5–50% | 5–30% | 5–25% |
| SC: | <=0.5 | <=0.45 | <=0.40 |
| SHGC: | <=0.45 | <=0.40 | <=0.35 |
| $T_{UV}$: | <=40% | <=35% | <=25% |
| $R_s$ (Ω/sq): | <250 | <100 | <60 |

Certain terms are prevalently used in the glass coating art, particularly when defining the properties and solar management characteristics of coated glass. Such terms are used herein in accordance with their well known meaning. For example, as used herein:

Intensity of reflected visible wavelength light, i.e. "reflectance" is defined by its percentage and is reported as $R_x Y$ (i.e. the Y value cited below in ASTM E-308-85), wherein "X" is either "G" for glass side or "F" for film side. "Glass side" (e.g. "G") means, as viewed from the side of the glass substrate opposite that on which the coating resides, while "film side" (i.e. "F") means, as viewed from the side of the glass substrate on which the coating resides.

Color characteristics are measured and reported herein using the CIE LAB a*, b* coordinates and scale (i.e. the CIE a*b* diagram, Ill. CIE-C, 2 degree observer). Other similar coordinates may be equivalently used such as by the subscript "h" to signify the conventional use of the Hunter Lab Scale, or Ill. CIE-C, 10° observer, or the CIE LUV u*v* coordinates. These scales are defined herein according to ASTM D-2244-93 "Standard Test Method for Calculation of Color Differences From Instrumentally Measured Color Coordinates" Sep. 15, 1993 as augmented by ASTM E-308-85, Annual Book of ASTM Standards, Vol. 06.01 "Standard Method for Computing the Colors of Objects by 10 Using the CIE System" and/or as reported in IES LIGHTING HANDBOOK 1981 Reference Volume.

The terms "emittance" and "transmittance" are well understood in the art and are used herein according to their well known meaning. Thus, for example, the terms visible light transmittance (TY), infrared radiation transmittance, and ultraviolet radiation transmittance ($T_{UV}$) are known in the art. Total solar energy transmittance (TS) is then usually characterized as a weighted average of these values from 300 to 2500 nm (UV, visible and near IR). With respect to these transmittances, visible transmittance (TY), as reported herein, is characterized by the standard CIE Illuminant C, 2 degree observer, technique at 380–720 nm; near-infrared is 720–2500 nm; ultraviolet is 300–380 nm; and total solar is 300–2500 nm. For purposes of emittance, however, a particular infrared range (i.e. 2,500–40,000 nm) is employed.

Visible transmittance can be measured using known, conventional techniques. For example, by using a spectrophotometer, such as a Perkin Elmer Lambda 900 or Hitachi U4001, a spectral curve of transmission is obtained. Visible transmission is then calculated using the aforesaid ASTM 308/2244-93 methodology. A lesser number of wavelength points may be employed than prescribed, if desired. Another technique for measuring visible transmittance is to employ a spectrometer such as a commercially available Spectrogard spectrophotometer manufactured by Pacific Scientific Corporation. This device measures and reports visible transmittance directly. As reported and measured herein, visible transmittance (i.e. the Y value in the CIE tristimulus system, ASTM E-308-85) uses the Ill. C.,2 degree observer.

Another term employed herein is "sheet resistance". Sheet resistance ($R_S$) is a well known term in the art and is used herein in accordance with its well known meaning. It is here reported in ohms per square units. Generally speaking, this term refers to the resistance in ohms for any square of a layer system on a glass substrate to an electric current passed through the layer system. Sheet resistance is an indication of how well the layer or layer system is reflecting infrared energy, and is thus often used along with emittance as a measure of this characteristic. "Sheet resistance" may for example be conveniently measured by using a 4-point probe ohmmeter, such as a dispensable 4-point resistivity probe with a Magnetron Instruments Corp. head, Model M-800 produced by Signatone Corp. of Santa Clara, Calif.

The terms "heat treatment" and "heat treating" as used herein mean heating the article to a temperature sufficient to enabling thermal tempering, bending, and/or heat strengthening of the glass inclusive article. This definition includes, for example, heating a coated article to a temperature of at least about 580 or 600 degrees C. for a sufficient period to enable tempering and/or heat strengthening. In some instances, the HT may be for at least about 4 or 5 minutes.

Once given the above disclosure many other features, modifications and improvements will become apparent to the skilled artisan. Such other features, modifications and improvements are therefore considered to be a part of this invention, the scope of which is to be determined by the following claims:

What is claimed is:

1. A coated article having blue glass side reflective color, the coated article comprising:
   a glass substrate;
   a layer comprising tin oxide provided on and contacting a surface of the glass substrate;
   a layer comprising silicon nitride provided on and contacting the layer comprising tin oxide;
   an infrared (IR) reflecting layer located on the substrate over the layer comprising tin oxide and over the layer comprising silicon nitride, wherein the IR reflecting layer comprises one or more of NiCr, Cr, Nb, and NbZr, and wherein the coated article has no infrared (IR) reflecting layer comprising significant amounts of Ag or Au;
   a dielectric layer provided on the substrate over at least the IR reflecting layer; and
   wherein a combined thickness of the layer comprising tin oxide and the layer comprising silicon nitride is from 700 to 900 Å wherein the coated article has blue glass side reflective color.

2. The coated article of claim 1, wherein a combined thickness of the layer comprising tin oxide and the layer comprising silicon nitride is from 750–850 Å.

3. The coated article of claim 1, wherein the dielectric layer located over at least the IR reflecting layer comprises silicon nitride.

4. The coated article of claim 1, wherein the coated article is heat treated.

5. The coated article of claim 1, wherein the IR reflecting layer is in direct contact with the layer comprising silicon nitride.

6. The coated article of claim 1, wherein the coated article is one of a monolithic window unit, an insulating glass (IG) window unit, and a laminated vehicle windshield.

7. The coated article of claim 1, wherein the layer comprising tin oxide further comprises nitrogen.

8. The coated article of claim 1, wherein the layer comprising silicon nitride further comprises from 1 to 12% aluminum.

9. The coated article of claim 1, wherein the coated article has a visible transmission from about 6 to 80%.

10. The coated article of claim 1, wherein the coated article has a visible transmission of from about 10–50%.

11. The coated article of claim 1, wherein the coated article has a sheet resistance ($R_s$) of less than 250 ohms/square.

12. The coated article of claim 1, wherein the coated article has a sheet resistance ($R_s$) of less than 100 ohms/square.

13. The coated article of claim 1, wherein the coated article includes a multi-layer coating consisting essentially of the layer comprising tin oxide, the layer comprising silicon nitride, the IR reflecting layer, and the dielectric layer.

14. A heat treated coated article having blue glass side reflective color, the coated article comprising:
   a glass substrate;
   a layer comprising tin oxide supported by the glass substrate and being located beneath any and all IR reflecting layer(s) of the coated article;
   a layer comprising silicon nitride provided on and contacting the layer comprising tin oxide;
   an infrared (IR) reflecting layer located over the layer comprising tin oxide and over the layer comprising silicon nitride, wherein the IR reflecting layer comprises one or more of NiCr, Cr, Nb, and NbZr, and wherein the coated article has no infrared (IR) reflecting layer comprising significant amounts of Ag or Au;
   a dielectric layer provided on the substrate over at least the IR reflecting layer; and
   wherein a combined thickness of the layer comprising tin oxide and the layer comprising silicon nitride is from 700 to 900 Å wherein the coated article has blue glass side reflective color.

15. The coated article of claim 14, wherein the dielectric layer located over at least the IR reflecting layer comprises silicon nitride.

16. The coated article of claim 14, wherein the IR reflecting layer is in direct contact with the layer comprising silicon nitride.

17. The coated article of claim 14, wherein the layer comprising tin oxide further comprises nitrogen.

18. The coated article of claim 14, wherein the coated article has a sheet resistance ($R_s$) of less than 250 ohms/square.

19. A coated article having green glass side reflective color, the coated article comprising:

a glass substrate;
a layer comprising tin oxide provided on and contacting a surface of the glass substrate;
a layer comprising silicon nitride provided on and contacting the layer comprising tin oxide;
an infrared (IR) reflecting layer located on the substrate over the layer comprising tin oxide and over the layer comprising silicon nitride, wherein the JR reflecting layer comprises one or more of NiCr, Cr, Nb, and NbZr, and wherein the coated article has no infrared (IR) reflecting layer comprising significant amounts of Ag or Au;
a dielectric layer provided on the substrate over at least the JR reflecting layer; and
wherein a combined thickness of the layer comprising tin oxide and the layer comprising silicon nitride is from 1,000 to 1,400 Å wherein the coated article has green glass side reflective color.

20. The coated article of claim 19, wherein a combined thickness of the layer comprising tin oxide and the layer comprising silicon nitride is from 1,000 to 1,300 Å.

* * * * *